US009520455B2

(12) United States Patent
Oh et al.

(10) Patent No.: US 9,520,455 B2
(45) Date of Patent: Dec. 13, 2016

(54) ORGANIC LIGHT EMITTING DISPLAY AND METHOD OF FABRICATING THE SAME

(71) Applicant: LG Display Co., Ltd., Seoul (KR)

(72) Inventors: Kum-Mi Oh, Seoul (KR); Kyung-Mo Son, Paju-si (KR); Sung-Hoon Kim, Ulsan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/792,117

(22) Filed: Jul. 6, 2015

(65) Prior Publication Data
US 2016/0005804 A1    Jan. 7, 2016

(30) Foreign Application Priority Data

Jul. 4, 2014    (KR) .................. 10-2014-0083926

(51) Int. Cl.
  *H01L 27/32*  (2006.01)
  *H01L 51/05*  (2006.01)
(52) U.S. Cl.
  CPC ....... *H01L 27/3262* (2013.01); *H01L 51/0562* (2013.01); *H01L 2227/323* (2013.01)
(58) Field of Classification Search
  None
  See application file for complete search history.

(56) References Cited

U.S. PATENT DOCUMENTS

| 5,173,792 | A  | * | 12/1992 | Matsueda | G02F 1/136213 257/E27.111 |
| 2010/0078666 | A1 | * | 4/2010 | Mochiku | H01L 29/78624 257/98 |
| 2015/0130691 | A1 | * | 5/2015 | Jeon | G09G 3/3225 345/82 |

FOREIGN PATENT DOCUMENTS

WO    WO 9408331 A1 *  4/1994  ......... G02F 1/13624

* cited by examiner

*Primary Examiner* — Matthew Reames
*Assistant Examiner* — Steven B Gauthier
(74) *Attorney, Agent, or Firm* — Birch, Stewart, Kolasch & Birch, LLP

(57) ABSTRACT

A subpixel structure for a display device and a method of fabricating the display device are discussed. The subpixel structure can include a light emitting diode, a first switching transistor having a first gate electrode and a first active layer, a driving transistor having a second gate electrode and a second active layer, a second switching transistor including a third gate electrode and a third active layer, and at least one of the first, second and third gate electrodes is disposed between the corresponding first, second and third active layers and a substrate.

17 Claims, 23 Drawing Sheets

ORGANIC LIGHT EMITTING DISPLAY AND METHOD OF FABRICATING THE SAME

This application claims the benefit of Patent Application No. 10-2014-0083926, filed in the Republic of Korea on Jul. 4, 2014, which is hereby incorporated by reference as if fully set forth herein.

BACKGROUND OF THE INVENTION

1. Field of the Invention

The present invention relates to an organic light emitting display and a method of fabricating the same, and more particularly, to an organic light emitting display having high resolution and high reliability and a method of fabricating the same.

2. Discussion of the Related Art

An image display, which displays various pieces of information on a screen, is key technology of the information age and is being developed toward lightweight, portable and high-performance trends. Thus, a flat display, which may reduce weight and volume, i.e., disadvantages of CRTs, has been spotlighted.

A flat display includes thin film transistors formed on a substrate and used as switching elements and driving elements. The thin film transistor includes an active layer forming a channel area, a gate electrode overlapping the channel area, and source and drain electrodes disposed opposite each other with the channel area interposed therebetween.

In such an active layer, an amorphous silicon thin film is deposited on the substrate and is crystallized into polycrystalline silicon by heat treatment. In more detail, if laser light is radiated onto the amorphous silicon layer, cooling is carried out via momentary dissolution and coagulation processes and thus, polycrystalline silicon cores in a solid state are generated. Further, a growth process in which a solid and liquid interface proceeds in the upward direction and transverse direction of the polycrystalline silicon cores according to a temperature gradient is carried out. In such a coagulation process, grains in the solid state grown in three or more directions meet on one line and such an interface forms a grain boundary. However, since the amorphous silicon layer dissolved by laser light has a high coagulation speed and a space to receive volume expansion according to changes between the solid and liquid states of the amorphous silicon layer is insufficient, the amorphous silicon layer at a point in which the grain boundaries formed by core growth in three or more directions meet, i.e., an active layer 16, protrudes upwards and forms protrusions, as exemplarily shown in FIG. 1. Therefore, an electric field is concentrated upon the protrusions of the active layer 16 and causes dielectric breakdown of a gate insulating film 14 and thus, an electrical short between a gate electrode 18 and the active layer 16 occurs. Further, conventionally, a storage area and a storage electrode of the active layer 16 overlap each other with the gate insulating layer 14 interposed therebetween and form a storage capacitor over a substrate 1. Here, since the storage area of the active layer 16 is formed on a buffer layer 12 through a doping process executed separately from the channel area of the active layer 16 but is located at an area different from the channel area, high resolution is not acquired. Moreover, if a flexible substrate is used to make a panel thinner, current of the transistors may be degraded due to impurities, such as mobile charges introduced from the flexible substrate.

SUMMARY OF THE INVENTION

Accordingly, the present invention is directed to an organic light emitting display and a method of fabricating the same that substantially obviates one or more problems due to limitations and disadvantages of the related art.

An object of the present invention is to provide an organic light emitting display having high resolution and high reliability and a method of fabricating the same.

Additional advantages, objects, and features of embodiments of the invention will be set forth in part in the description which follows and in part will become apparent to those having ordinary skill in the art upon examination of the following or may be learned from practice of the embodied invention. The objectives and other advantages of the embodied invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the embodied invention. In the drawings.

DETAILED DESCRIPTION OF THE INVENTION

Reference will now be made in detail to embodiments of the invention, examples of which are illustrated in the accompanying drawings. Wherever possible, the same reference numbers will be used throughout the drawings to refer to the same or like parts.

Figure 1:
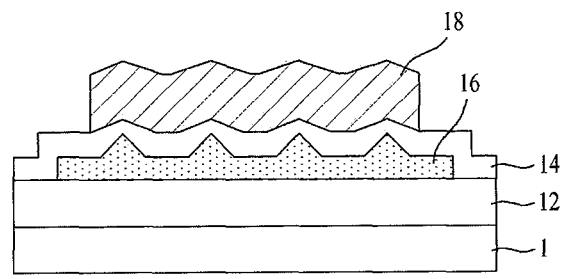
FIG. 1 is a cross-sectional view illustrating a transistor applied to a related art organic light emitting display.
Figure 2:
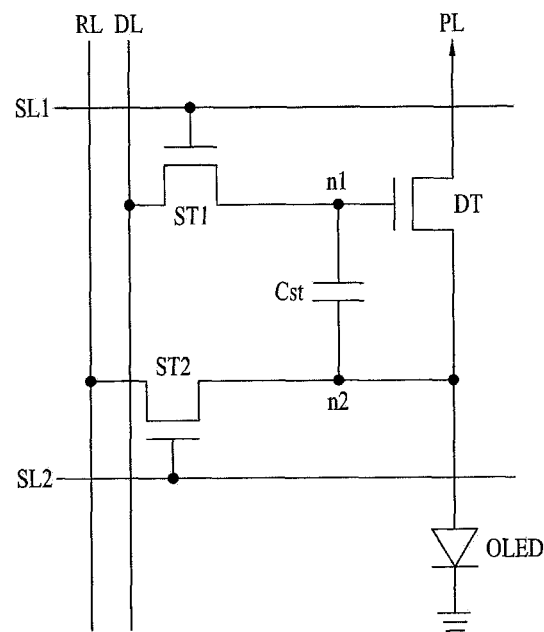
FIG. 2 is a circuit diagram illustrating each subpixel of an organic light emitting display in accordance with one embodiment of the present invention.

FIG. 2 is a circuit diagram illustrating each subpixel of an organic light emitting display in accordance with one embodiment of the present invention.

Each subpixel of the organic light emitting display shown in FIG. 2 includes an organic light emitting diode (OLED), first and second switching transistors ST1 and ST2, a driving transistor DT and a storage capacitor Cst.

Figure 3:
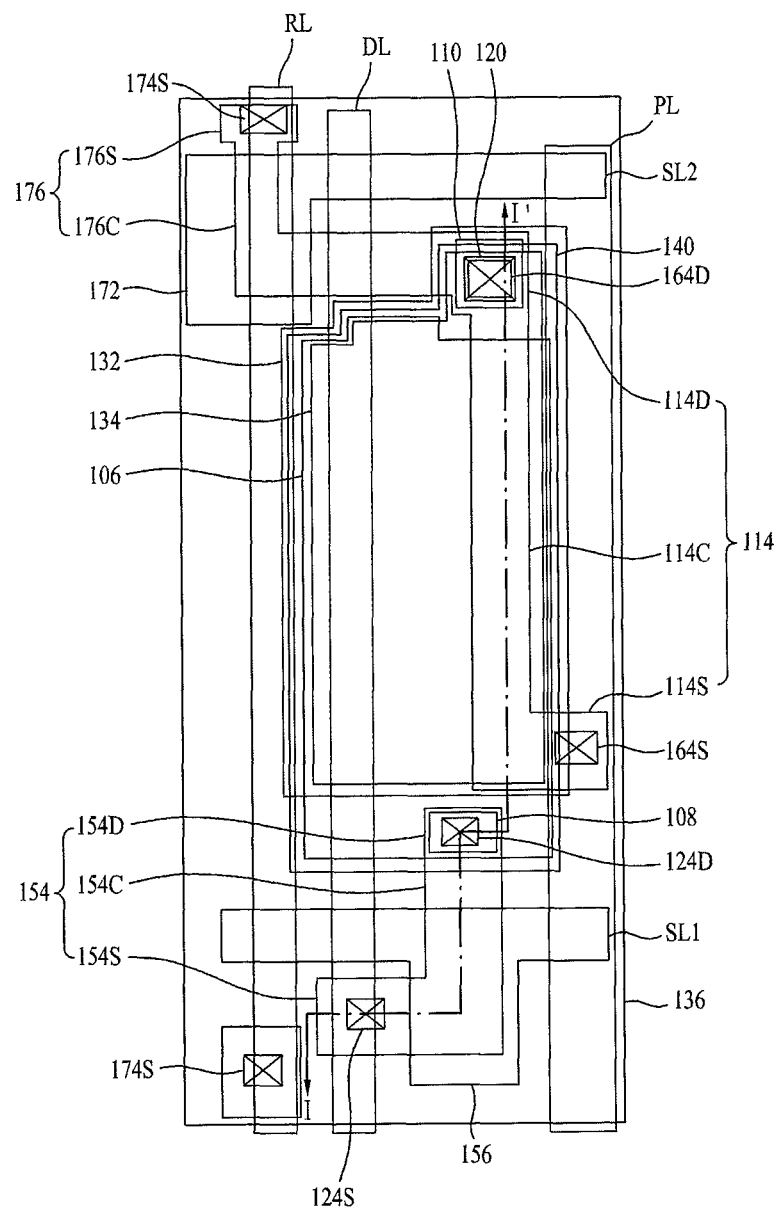
FIG. 3 is a plan view illustrating the organic light emitting display shown in FIG. 2.

The first switching transistor ST1 is turned on when a scan pulse is supplied to a $2n-1^{th}$ (here, n being a natural number) scan line SL, and supplies data voltage supplied to a data line DL to a first node n1, i.e., the storage capacitor Cst and a gate electrode of the driving transistor DT. For this purpose, the first switching transistor ST1 includes a first gate electrode 156 connected to the $2n-1^{th}$ scan line SL1, a first source electrode 104 included in the data line DL, a first drain electrode 108 disposed opposite the first source electrode 104 and connected to a second gate electrode 106 of the driving transistor DT and the storage capacitor Cst, and a first active layer 154 forming a channel part between the first source electrode 104 and the first drain electrode 108, as shown in FIGS. 2 and 3.

Here, the first active layer 154 is formed on a gate insulating film 112 so as to be disposed above the first gate electrode 156. Such a first active layer 154 includes a first channel area 154C, a first source area 154S and a first drain area 154D disposed opposite each other with the first channel area 154C interposed therebetween. The first channel area 154C overlaps the first gate electrode 156 with the gate insulating film 112 interposed therebetween. An n-type or p-type impurity is injected into the first source area 154S and the side surface of the first source area 154S is exposed through a first source contact hole 124S and connected to the first source electrode 104. Here, the first source contact hole 124S passes through a storage insulating film 126, the gate insulating film 112, the first source area 154S and first and second interlayer insulating films 128 and 116 and exposes the side surface of the first source area 154S and the upper surface of a substrate 101. An n-type or p-type impurity is injected into the first drain area 154D and the side surface of the first drain area 154D is exposed through a first drain contact hole 124D and connected to the first drain electrode 108. Here, the first drain contact hole 124D passes through a part of the second gate electrode 106, the gate insulating film 112, the first drain area 154D and the first and second interlayer insulating films 128 and 116 and exposes the side surface of the first drain area 154D and the second gate electrode 106.

The driving transistor DT adjusts the amount of light generated from the organic light emitting diode OLED by controlling current supplied from a power line PL to the organic light emitting diode OLED in response to a data voltage stored in the storage capacitor Cst. For this purpose, the driving transistor DT includes the second gate electrode 106 connected to the first drain electrode 108 of the switching transistor ST1, a second source electrode included in the power line PL, a second drain electrode 110 disposed opposite the second source electrode and connected to an anode electrode 132, and a second active layer 114 forming a channel part between the second source electrode and the second drain electrode 110, as exemplarily shown in FIGS. 2 and 3.

The second gate electrode 106 is exposed through the first drain contact hole 124D and connected to the first drain electrode 108 of the switching transistor ST1. Further, the second gate electrode 106 is formed on the storage insulating film 126 so as to overlap a storage electrode 140 and thus forms the storage capacitor Cst.

The second source electrode is included in the power line PL and connected to the side surface of a second source area 114S of the second active layer 114 through a second source contact hole 162S exposing the side surface of the second source area 114S. Here, the second source contact hole 162S passes through the storage insulating film 126, the gate insulating film 112, the second source area 114S and the first and second interlayer insulating films 128 and 116 and exposes the side surface of the second source area 114S, in the same manner as the first source contact hole 124S.

The second drain electrode 110 is exposed through a pixel contact hole 120 formed through a passivation film 118 and connected to the anode electrode 132. Further, the second drain electrode 110 is connected to the side surface of a second drain area 114D of the second active layer 114 through a second drain contact hole 164D exposing the side surface of the second drain area 114D. Here, the second drain contact hole 164D passes through the storage insulating film 126, the gate insulating film 112, the second drain 114D and the first and second interlayer insulating films 128 and 116 and exposes the side surface of the second drain area 114D.

The second active layer 114 is formed on the gate insulating film 112 so as to be disposed above the second gate electrode 106. Such a second active layer 114 includes a second channel area 114C, a second source area 114S and a second drain area 114D disposed opposite each other with the second channel area 114C interposed therebetween. The second channel area 114C is formed on the gate insulating film 112 and overlaps the second gate electrode 106 with the gate insulating film 112 interposed therebetween. An n-type or p-type impurity is injected into the second source area 114S and the side surface of the second source area 114S is exposed through a second source contact hole 142S and connected to the power line PL. An n-type or p-type impurity is injected into the second drain area 114D and the second drain area 114D is exposed through the second drain contact hole 164D and connected to the second drain electrode 110.

Figure 4:
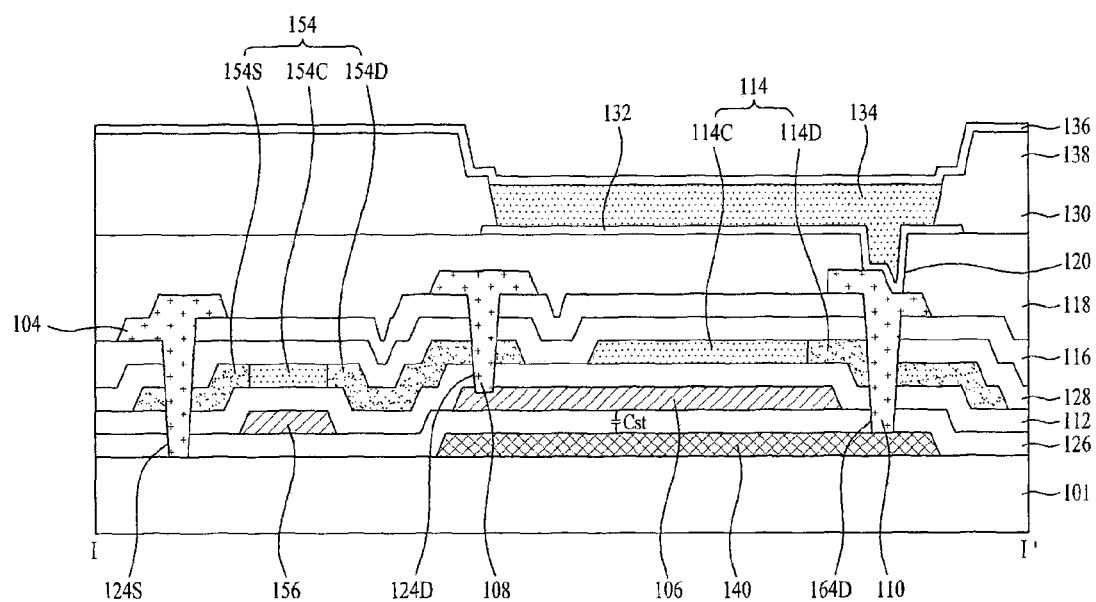
FIG. 4 is a cross-sectional view illustrating the organic light emitting display taken along line I-I' of FIG. 3.

The second switching transistor ST2 is turned on, when a scan pulse is supplied to a $2n^{th}$ (here, n being a natural number) scan line SL (e.g., SL2), and initializes a second node n2 with reference voltage Vref supplied through a reference voltage line RL, as exemplarily shown in FIGS. 3 and 4.

For this purpose, the second switching transistor ST2 includes a third gate electrode 172 connected to the $2n^{th}$ (here, n being a natural number) scan line SL, a third source electrode included in the reference voltage line RL, the second drain electrode 110 disposed opposite the third source electrode, and a third active layer 176 forming a channel part between the third source electrode and the second drain electrode 110.

The third source electrode is included in the reference voltage line RL and connected to the side surface of a third source area 176S of the third active layer 176 through a third source contact hole 174S exposing the side surface of the third source area 176S. Here, the third source contact hole 174S passes through the storage insulating film 126, the gate insulating film 112, the third source area 176S and the third and second interlayer insulating films 128 and 116 and exposes the side surface of the third source area 174S, in the same manner as the first source contact hole 124S.

The third active layer 176 extends from the second active layer 114 and is formed on the gate insulating film 112 so as to be disposed above the third gate electrode 172. Such a third active layer 176 includes a third channel area 176C connected to the second drain area 114D and the third source area 176S disposed opposite the second drain area 114D with the third channel area 176C interposed therebetween.

The third channel area 176C overlaps the third gate electrode 172 with the gate insulating film 112 interposed therebetween. An n-type or p-type impurity is injected into the third source area 176S, exposed through a third source contact hole 152S and connected to the reference voltage line RL.

In the organic light emitting diode OLED, when voltage is applied between the anode electrode 132 and a cathode electrode 136, holes from the first electrode 132 and electrons from the second electrode 136 are recombined in a light emitting layer, generating excitons, and, when the excitons return to a ground state, light is emitted. For this purpose, the organic light emitting diode OLED includes the anode electrode 132 connected to the second drain electrode 110 of the driving transistor DT, an organic common layer 134 formed on the anode electrode 132, and the cathode electrode 136 formed on the organic common layer 134.

The anode electrode 132 is a transparent electrode and the cathode electrode 136 is a reflective electrode. In this instance, the organic light emitting display shown in FIGS. 3 and 4 emits light through the bottom surface thereof, i.e., the substrate 101. According to materials of the anode electrode 132 and the cathode electrode 136, the organic light emitting display shown in FIGS. 3 and 4 may emit light through the top surface thereof, i.e., the cathode electrode 136, or both the top and bottom surfaces thereof. Therefore, the materials of the anode electrode 132 and the cathode electrode 136 are not limited thereto.

The organic common layer 134 includes a hole related layer, a light emitting layer and an electron related layer stacked on the anode electrode 132, exposed by a bank hole formed by a bank insulating film 130, in order or in inverse order. Here, the bank insulating film 130 is formed integrally with a spacer 138 to maintain a cell gap through the same process. Thereby, one micro spacer 138 and the bank insulating film 130 are simultaneously formed and thus, the number of used masks may be reduced and process time and costs may be reduced.

The storage capacitor Cst includes a first electrode connected to the first node n1 and a second electrode connected to the second node n2, as exemplarily shown in FIG. 2, and stores a voltage difference between the first and second nodes n1 and n2. By voltage stored in the storage capacitor Cst, even if the switching transistor ST1 is turned off, the driving transistor DT supplies uniform current until a data signal of the next frame is supplied, and maintains light emission of the organic light emitting diode OLED.

Figure 5:
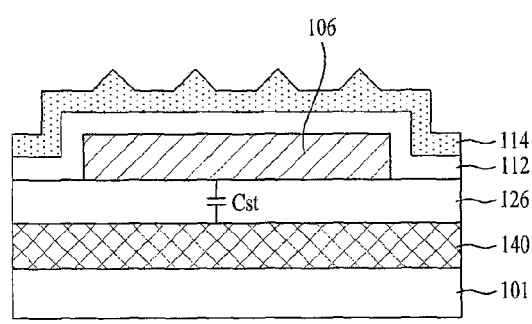
FIG. 5 is a cross-sectional view illustrating a storage capacitor shown in FIG. 4 in detail.

Therefore, the storage capacitor Cst is formed by overlapping the second electrode, i.e., the storage electrode 140 formed on the substrate 101, and the first electrode, i.e., the second gate electrode 106 of the driving transistor DT, with the storage insulating film 126 interposed therebetween, as exemplarily shown in FIGS. 4 and 5. The storage electrode 140 is exposed through the second drain contact hole 164D and connected to the second drain electrode 110 of the driving transistor DT. The storage electrode 140 is formed by depositing a low resistance metal, for example, one or at least two of aluminum (Al), an aluminum alloy, such as aluminum-neodymium (AlNd), copper (Cu), a copper alloy, molybdenum (Mo) and molybdenum-titanium (MoTi). The second gate electrode 106 of the driving transistor DT is exposed through the first drain contact hole 124D and connected to the first drain electrode 108 of the first switching transistor ST1.

As described above, in an embodiment of the present invention, the storage electrode 140 formed of a low resistance metal without any additional doping process and the second gate electrode 106 are disposed below the second active layer 114 so as to overlap the second active layer 114, thus being capable of maximizing the area of the storage capacitor Cst and implementing high resolution.

Further, in this embodiment of the present invention, since the second gate electrode 106 is located below the second active layer 114, as exemplarily shown in FIG. 5, an electrical short between protrusions of the second active layer 114 generated during a crystallization process of the second active layer 114 and the second gate electrode 106 may be prevented and thus, reliability may be improved. Moreover, since the first and third gate electrodes 156 and 172 are located below the first and third active layers 154 and 176, electrical short between protrusions of the first and third active layers 154 and 176 and the first and third gate electrodes 156 and 172 may be prevented and thus, reliability may be improved.

Further, in this embodiment of the present invention, since impurities, such as mobile charges introduced from the substrate 101 formed of a flexible material, such as polyimide, are blocked by the storage electrode 140, degradation of current of the driving transistor DT may be prevented and thus, reliability may be improved.

FIGS. 6A to 14B are plan and cross-sectional views illustrating a method of fabricating the organic light emitting display shown in FIGS. 3 and 4.

Figure 6A:
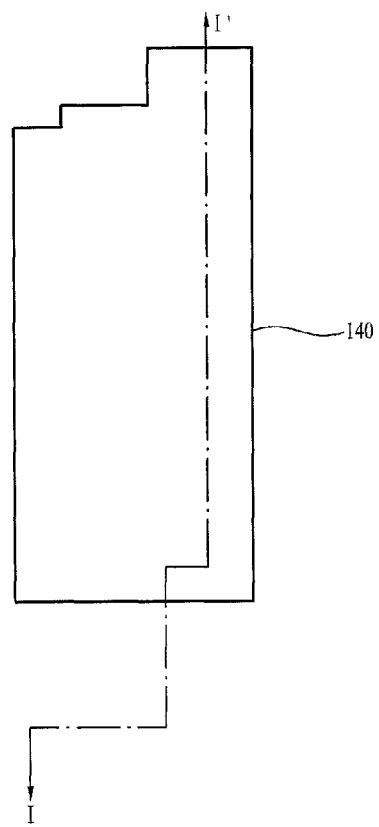
FIGS. 6A and 6B are plan and cross-sectional views illustrating a method of fabricating a storage electrode shown in FIGS. 3 and 4.
Figure 6B:
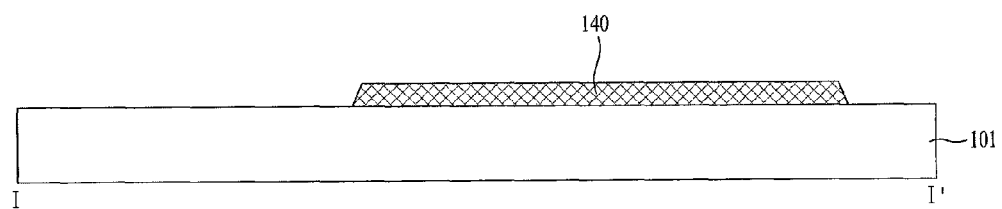

With reference to FIGS. 6A and 6B, the first storage electrode 140 is formed on the substrate 101 by a first mask process.

In more detail, the storage electrode 140 is formed by stacking a low resistance metal layer on the entire upper surface of the substrate 101 and then patterning the low resistance metal layer through photolithography and etching using a first mask.

Figure 7A:
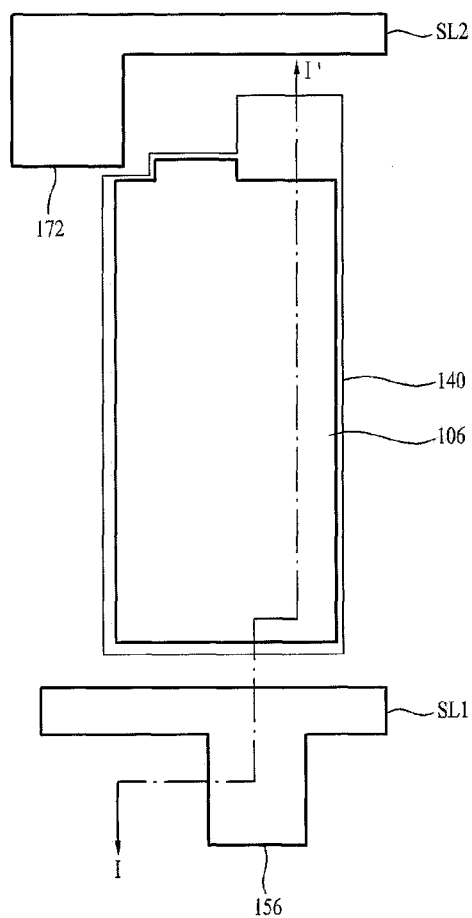
FIGS. 7A and 7B are plan and cross-sectional views illustrating a method of fabricating a gate electrode shown in FIGS. 3 and 4.
Figure 7B:
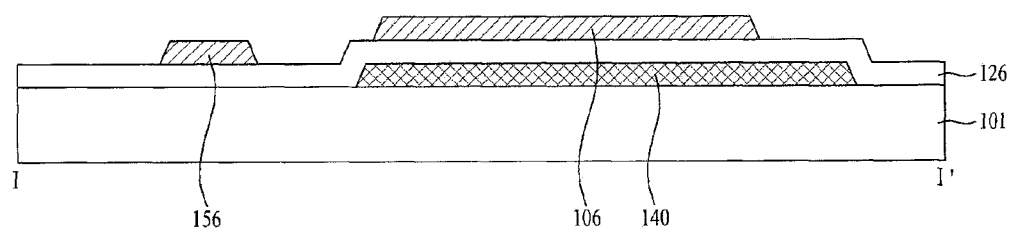

With reference to FIGS. 7A and 7B, the storage insulating film 126 and a gate pattern including the scan lines SL and the first to third gate electrodes 156, 106 and 172 are sequentially formed on the substrate 101 provided with the storage electrode 140.

In more detail, the storage insulating film 126 is formed by depositing an inorganic insulating material, such as SiOx or SiNx, on the entire upper surface of the substrate 101 provided with the storage electrode 140. Thereafter, the gate pattern including the scan lines SL and the first to third gate electrodes 156, 106 and 172 is formed by stacking a gate metal layer on the storage insulating film 126 and then patterning the gate metal layer through photolithography and etching using a second mask.

Figure 8A:
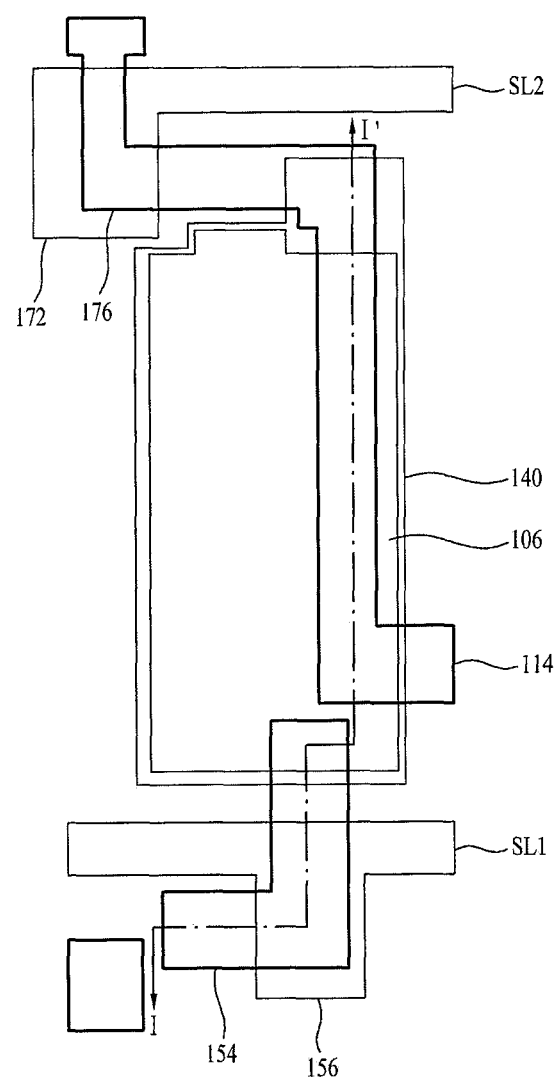
FIGS. 8A and 8B are plan and cross-sectional views illustrating a method of fabricating an active layer shown in FIGS. 3 and 4.
Figure 8B:
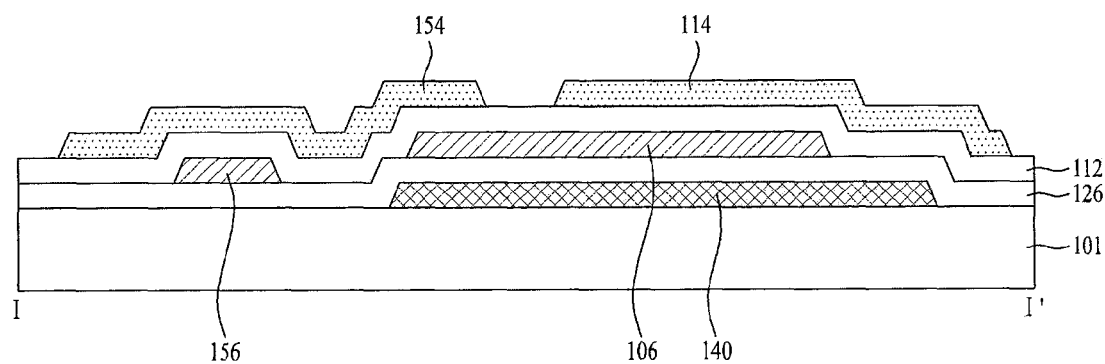

With reference to FIGS. 8A and 8B, the gate insulating film 112 and the first to third active layers 154, 114 and 176 are sequentially formed on the substrate 101 provided with the gate pattern.

In more detail, the gate insulating film 112 is formed by depositing an inorganic insulating material, such as SiOx or SiNx, on the entire upper surface of the substrate 101 provided with the gate pattern. Thereafter, an amorphous silicon thin film is deposited on the entire upper surface of the gate insulating film 112. Hydrogen is removed from the amorphous silicon thin film through a dehydrogenation process in which heat is applied to the substrate 101 provided with the amorphous silicon thin film deposited thereon. The dehydrogenation process may prevent degradation of surface characteristics of the amorphous silicon thin film caused by reaction of hydrogen included in the amorphous silicon thin film with oxygen present within a chamber during a laser crystallization process. After the dehydrogenation process, a polysilicon thin film is formed by crystallizing amorphous silicon through heat treatment. The first to third active layers 154, 114 and 176 are formed by patterning the polysilicon thin film through photolithography and etching using a third mask.

Figure 9A:
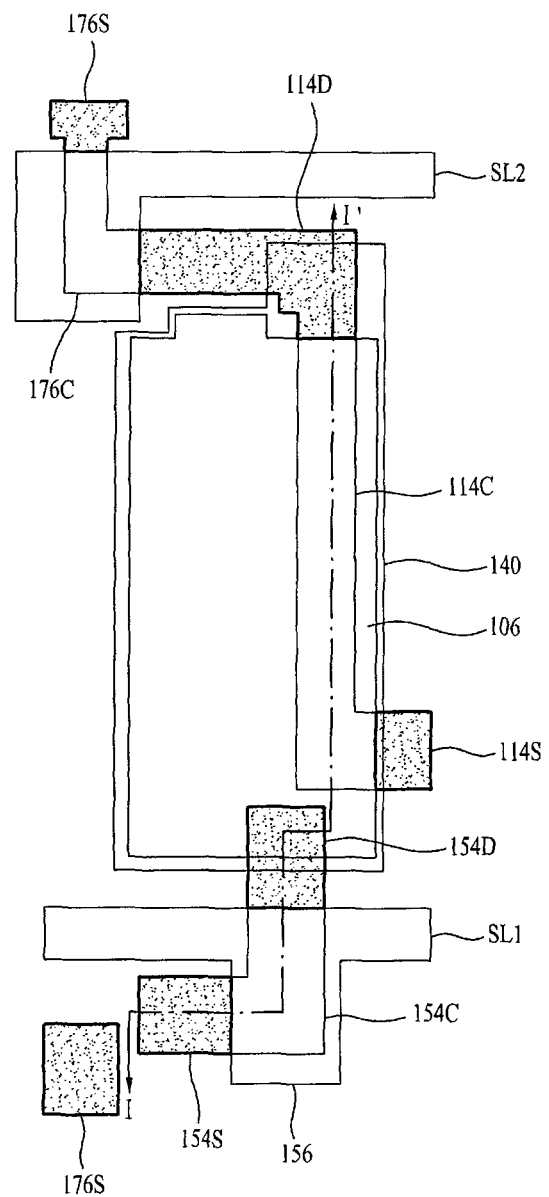
FIGS. 9A and 9B are plan and cross-sectional views illustrating a method of fabricating a source area and a drain area of an active layer shown in FIGS. 3 and 4.
Figure 9B:
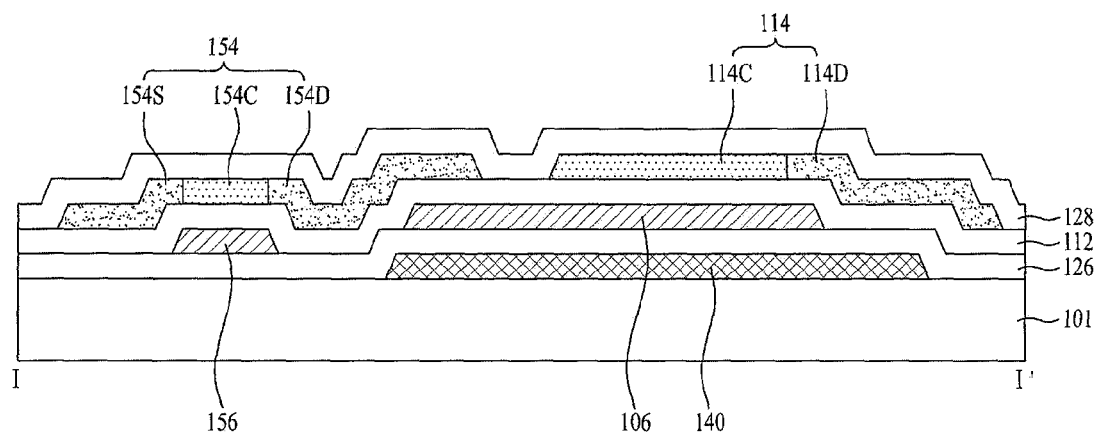

With reference to FIGS. 9A and 9B, the first interlayer insulating film 128 is formed on the substrate 101 provided with the first to third active layers 154, 114 and 176, and the source areas 154S, 114S and 176S and the drain areas 154D and 114D of the first to third active layers 154, 114 and 176 are formed.

In more detail, the first interlayer insulating film 128 is formed by depositing an inorganic insulating material, such as SiOx or SiNx, on the entire upper surface of the substrate 101 provided with the first and second active layers 154 and 114.

Thereafter, a photoresist is deposited on the entire upper surface of the first interlayer insulating film 128, and a photoresist pattern is formed on the first interlayer insulating film 128 by patterning the photoresist through photolithography using a fourth mask. The source areas 154S, 114S and 176S and the drain areas 154D and 114D of the first to third active layers 154, 114 and 176 are formed by injecting n-type or p-type impurities into the first to third active layers 154, 114 and 176 using the photoresist pattern as a mask.

Figure 10A:
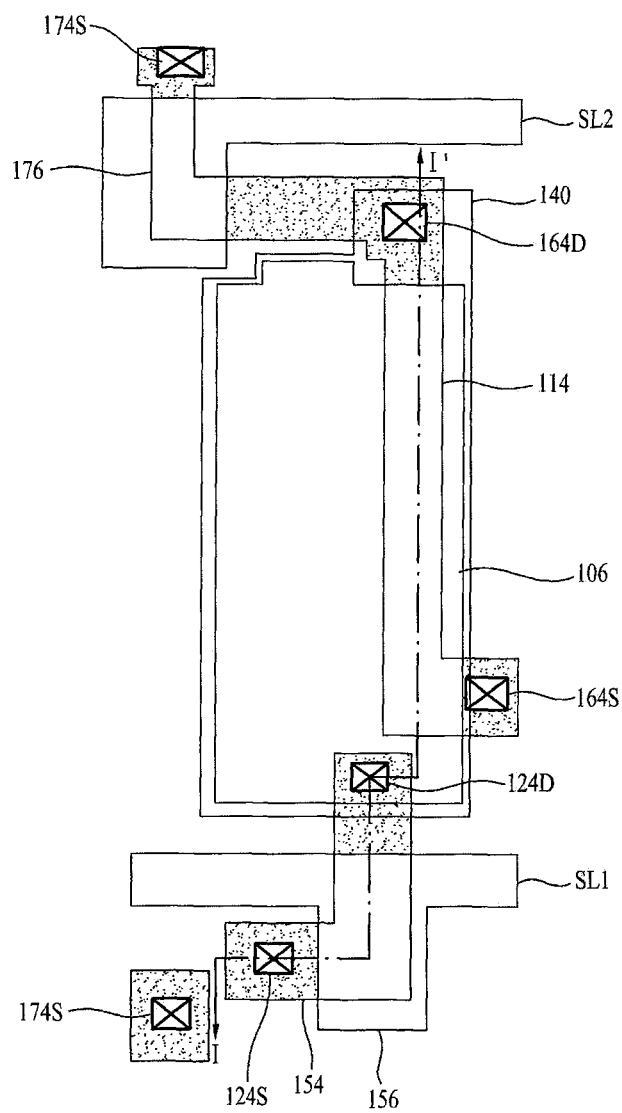
FIGS. 10A and 10B are plan and cross-sectional views illustrating a method of fabricating a source contact hole and a drain contact hole shown in FIGS. 3 and 4.
Figure 10B:
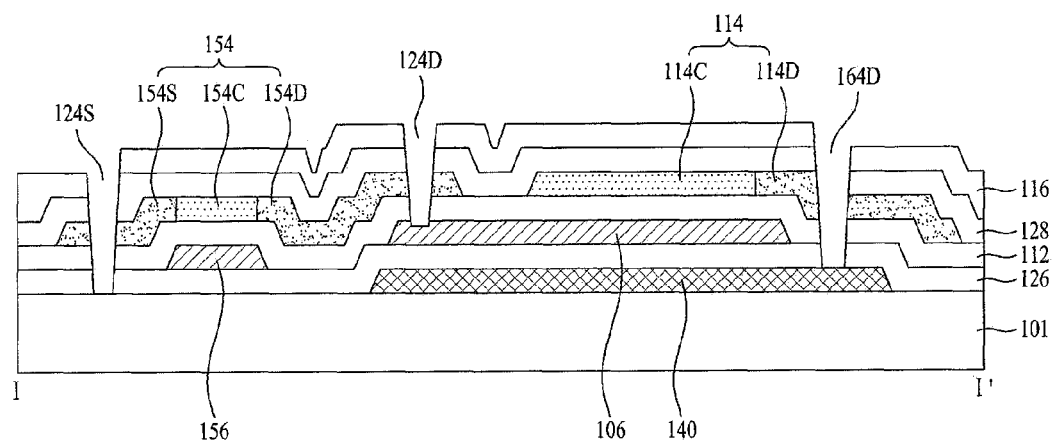

With reference to FIGS. 10A and 10B, the second interlayer insulating film 116 having the source contact holes 124S, 164S and 174S and the drain contact holes 124D and 164D is formed on the substrate 101 provided with the first interlayer insulating film 128.

In more detail, the second interlayer insulating film 116 is formed by depositing an inorganic insulating material, such as SiOx or SiNx, on the entire upper surface of the substrate 101 provided with the first interlayer insulating film 128. Thereafter, the impurities injected into the first to third active layers 154, 114 and 176 are activated by radiating laser light onto the first to third active layers 154, 114 and 176 or executing heat treatment, and the first to third active layers 154, 114 and 176 are hydrogenated by injecting hydrogen, removed by dehydrogenation, again into the first to third active layers 154, 114 and 176. Here, hydrogen injected into the first to third active layers 154, 114 and 176 may stabilize the first to third active layers 154, 114 and 176, improve interface characteristics and prevent charge movement from being trapped.

After hydrogenation, the first to third source contact holes 124S, 164S and 174S exposing the source areas 154S, 114S and 176S of the first to third active layers 154, 114 and 176 and the first and second drain contact holes 124D and 164D exposing the drain areas 154D and 114D of the first and second active layers 154 and 114 are formed through the storage insulating film 126, the gate insulating film 112, the first to third active layers 154, 114 and 176 and the first and second interlayer insulating films 128 and 116 selectively through photolithography and etching using a fifth mask. The first source contact hole 124S passes through the storage insulating film 126, the gate insulating film 112, the first source area 154S of the first active layer and the first and second interlayer insulating films 128 and 116 and exposes the side surface of the first source area 154S. The first drain contact hole 124D passes through the gate insulating film 112, the first drain area 154D of the first active layer and the first and second interlayer insulating films 128 and 116 and exposes the side surface of the first drain area 154D. The second source contact hole 164S passes through the storage insulating film 126, the gate insulating film 112, the second source area 114S overlapping the power line PL and the first and second interlayer insulating films 128 and 116 and exposes the side surface of the second source area 114S. The second drain contact hole 164D passes through the storage insulating film 126, the gate insulating film 112, the second drain area 114D of the second active layer and the first and second interlayer insulating films 128 and 116 and exposes the side surface of the second drain area 114D. The third source contact hole 174S passes through the storage insulating film 126, the gate insulating film 112, the third source area 176S of the third active layer and the first and second interlayer insulating films 128 and 116 and exposes the side surface of the third source area 176S.

Figure 11A:
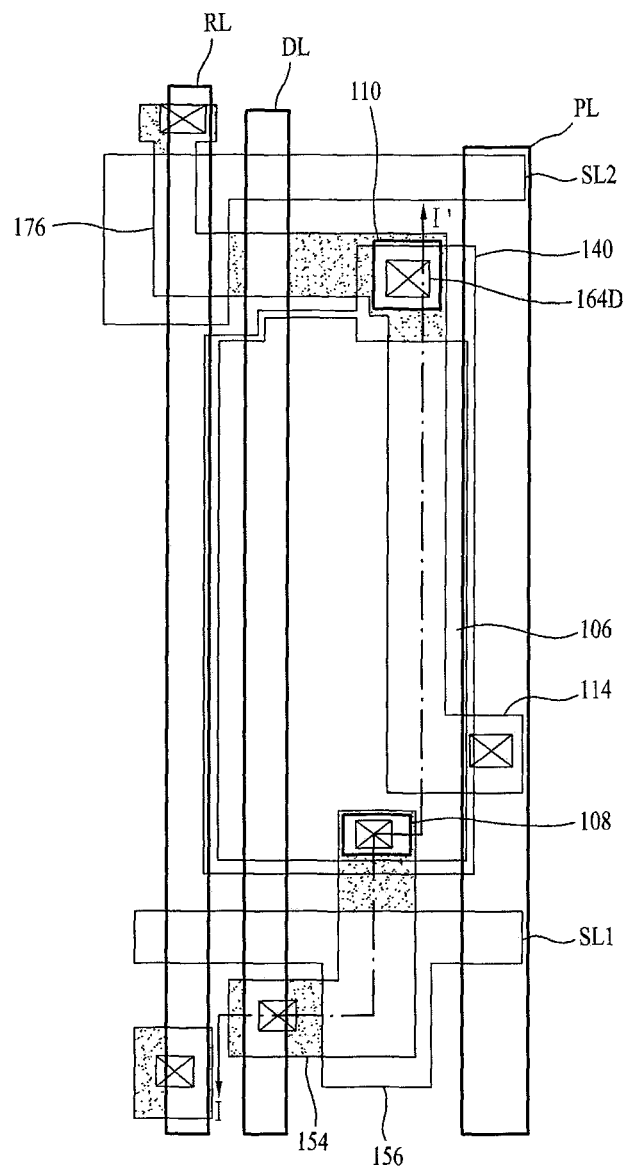
FIGS. 11A and 11B are plan and cross-sectional views illustrating a method of fabricating source and drain electrodes shown in FIGS. 3 and 4.
Figure 11B:
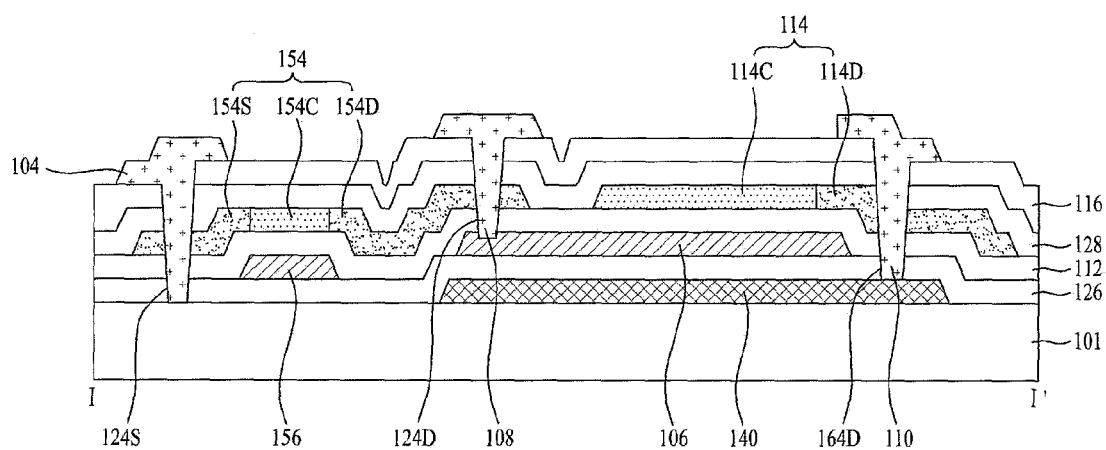

With reference to FIGS. 11A and 11B, the data lines DL, the power line PL, the source electrode 104 and the drain electrodes 108 and 110 are formed on the second interlayer insulating film 116.

In more detail, a source/drain metal layer is formed on the second interlayer insulating film 116, and the data lines DL, the power line PL, the source electrode 104 and the drain electrodes 108 and 110 are formed by patterning the source/drain metal layer through photolithography and etching using a sixth mask.

Figure 12A:
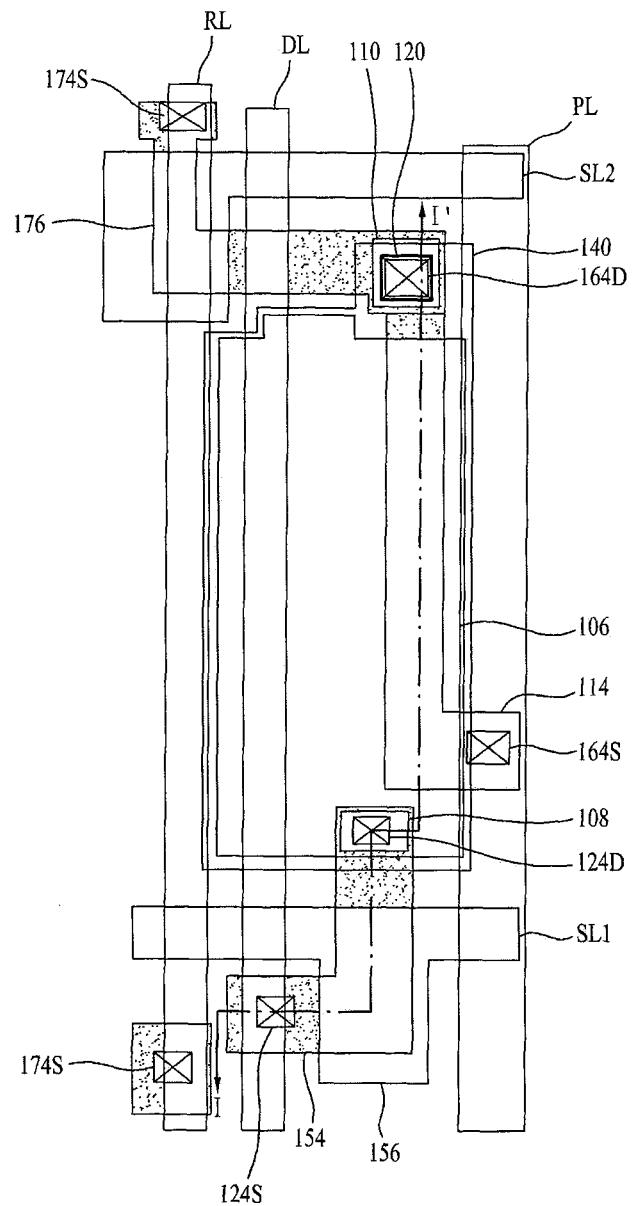
FIGS. 12A and 12B are plan and cross-sectional views illustrating a method of fabricating a pixel contact hole shown in FIGS. 3 and 4.
Figure 12B:
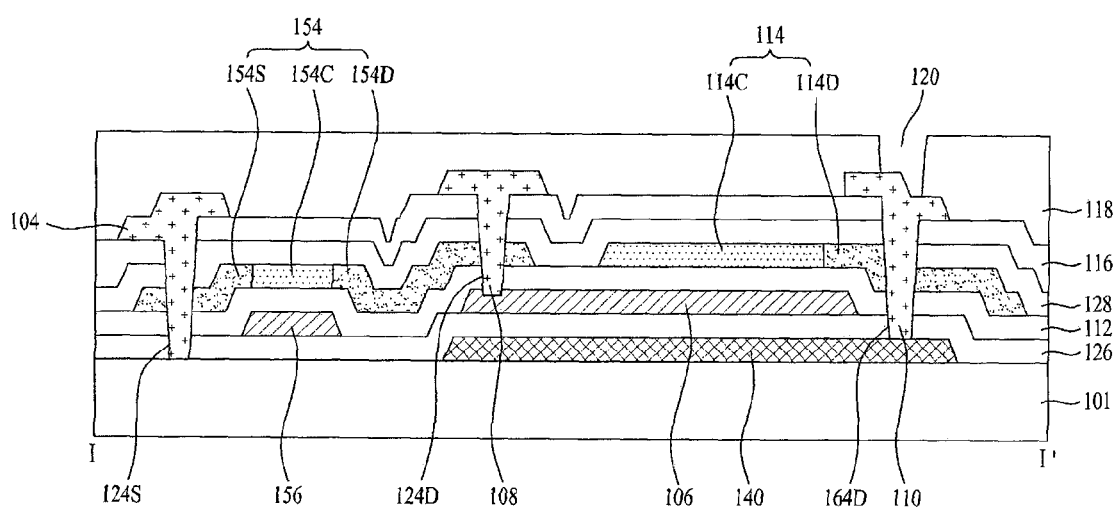

With reference to FIGS. 12A and 12B, the passivation film 118 having the pixel contact hole 120 is formed on the substrate 101 provided with the data lines DL, the power line PL, the source electrode 104 and the drain electrodes 108 and 110.

In more detail, the passivation film 118 is formed by forming an organic insulating film, such as a photosensitive acrylic resin, on the substrate 101 provided with the data lines DL, the power line PL, the source electrode 104 and the drain electrodes 108 and 110. Thereafter, the pixel contact hole 120 is formed by patterning the passivation film 118 through photolithography and etching using a seventh mask. The pixel contact hole 120 exposes the second drain electrode 110 of the driving transistor of a corresponding subpixel area.

Figure 13A:
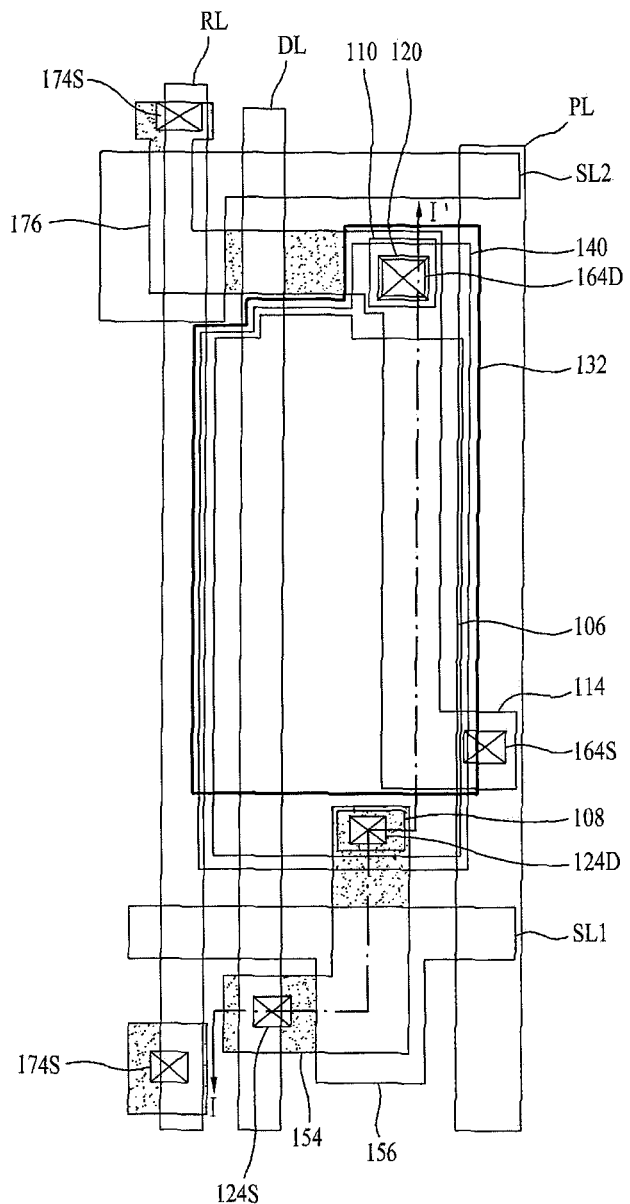
FIGS. 13A and 13B are plan and cross-sectional views illustrating a method of fabricating an anode electrode shown in FIGS. 3 and 4.
Figure 13B:
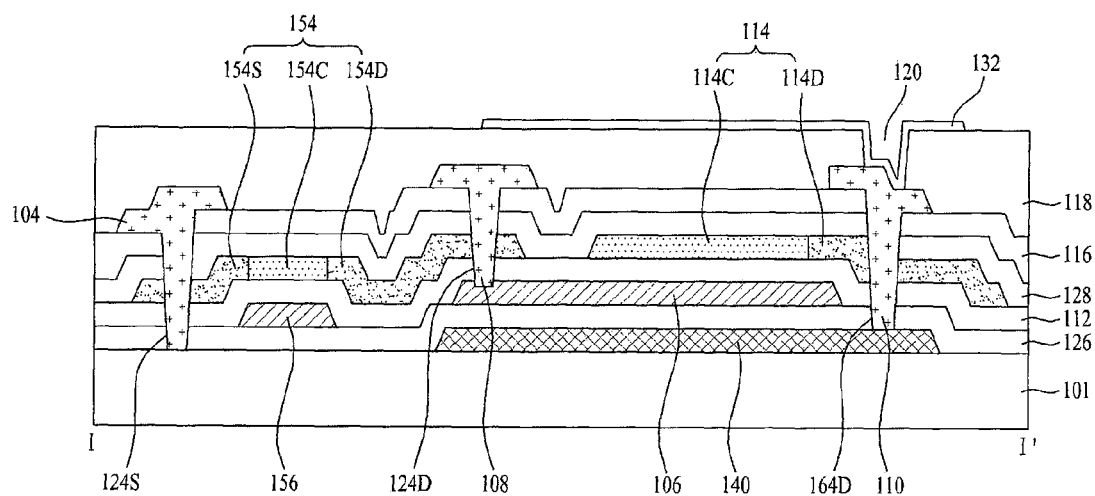

With reference to FIGS. 13A and 13B, the anode electrode 132 is formed on the substrate 101 provided with the passivation film 118 having the pixel contact hole 120.

In more detail, a transparent conductive material, such as indium tin oxide (hereinafter, referred to as ITO) or indium zinc oxide (hereinafter, referred to as IZO), is formed on the substrate 101 provided with the passivation film 118 having the pixel contact hole 120 through a deposition method, such as sputtering. Thereafter, the anode electrode 132 is formed by patterning the transparent conductive material through photolithography and etching using an eighth mask.

Figure 14A:
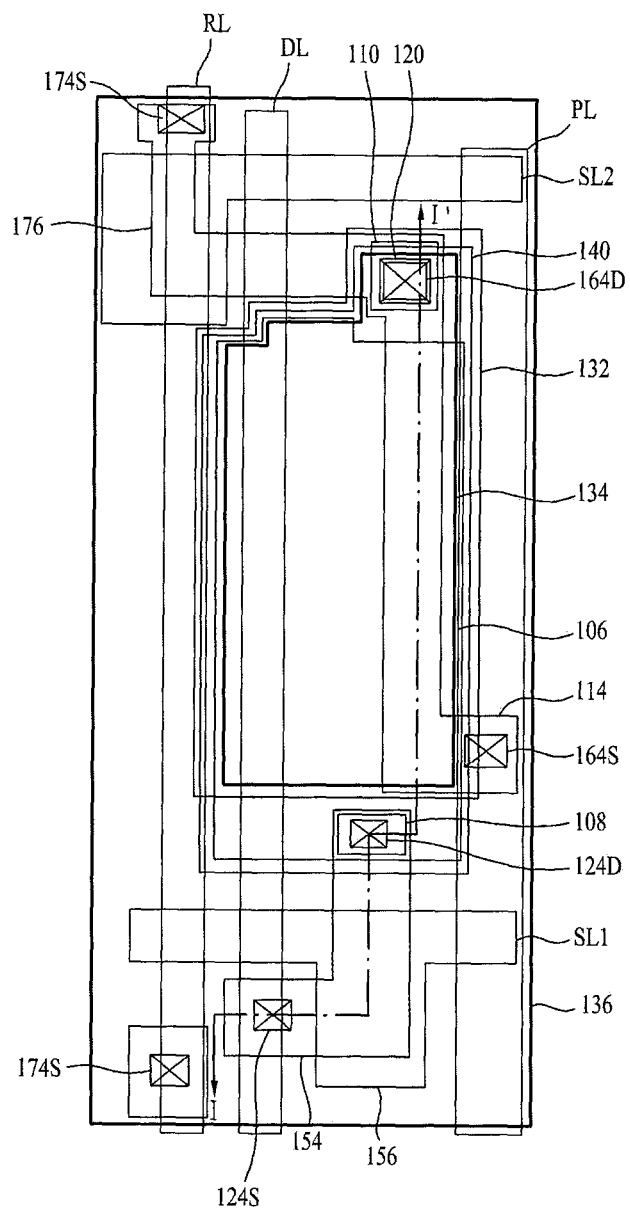
FIGS. 14A and 14B are plan and cross-sectional views illustrating a method of fabricating a bank insulating film, a spacer, an organic common layer and a cathode electrode shown in FIGS. 3 and 4.
Figure 14B:
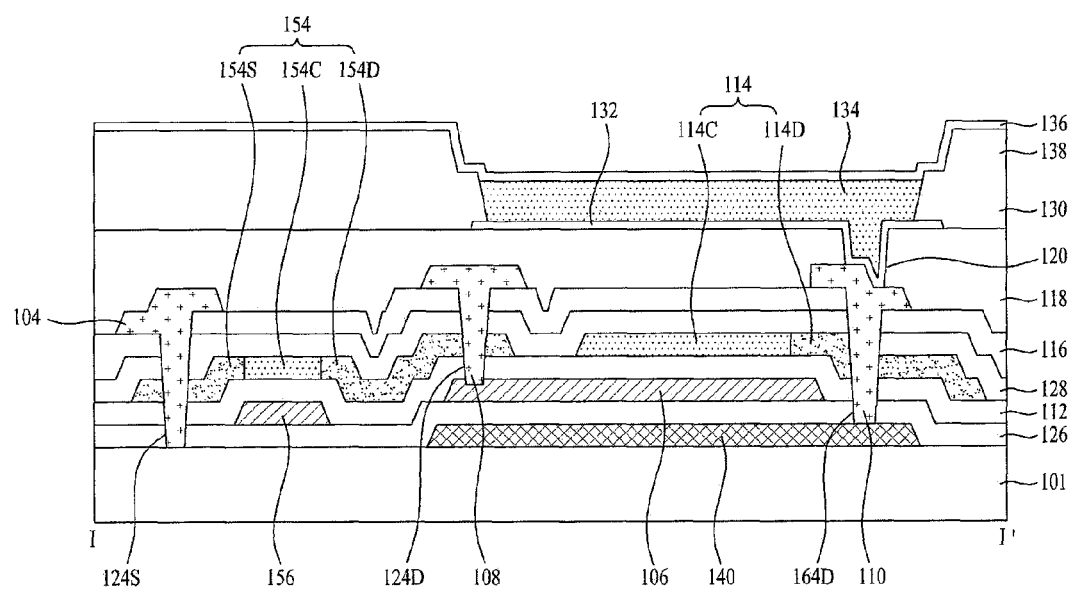

With reference to FIGS. 14A and 14B, the integrated bank insulating film 130 and spacer 138, the organic light emitting layer 134 and the cathode electrode 136 are sequentially formed on the substrate 101 provided with the anode electrode 132.

In more detail, an organic insulating material is applied to the entire upper surface of the substrate 101 provided with the anode electrode 132. Thereafter, the bank insulating film 130 including a bank hole to expose the anode electrode 132 and the spacer 138 integrated with the bank insulating film 130 are formed by patterning the organic insulating material through photolithography and etching using a ninth mask. Thereafter, the organic common layer 134 including a hole injection layer, a hole transport layer, a light emitting layer and an electron transport layer is formed within the bank hole to expose the anode electrode 132. Thereafter, the cathode electrode 136 is formed on the entire upper surface of the substrate 101 provided with the organic common layer 134.

Figure 15:
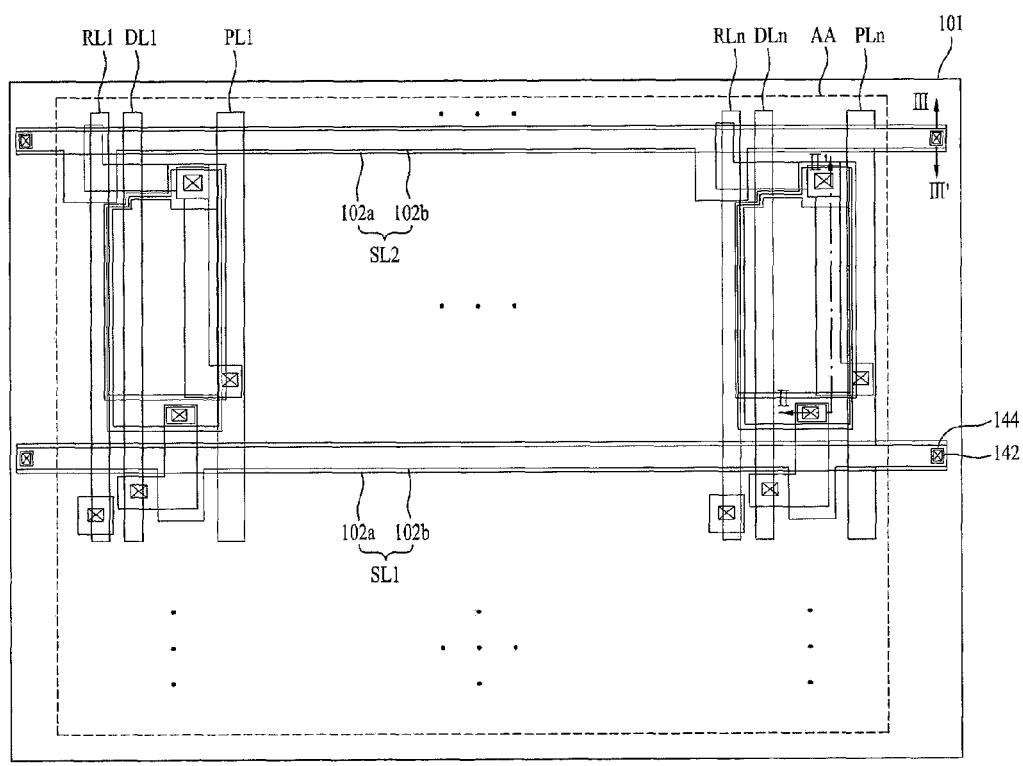
FIG. 15 is a plan view illustrating an organic light emitting display in accordance with another embodiment of the present invention.
Figure 16:
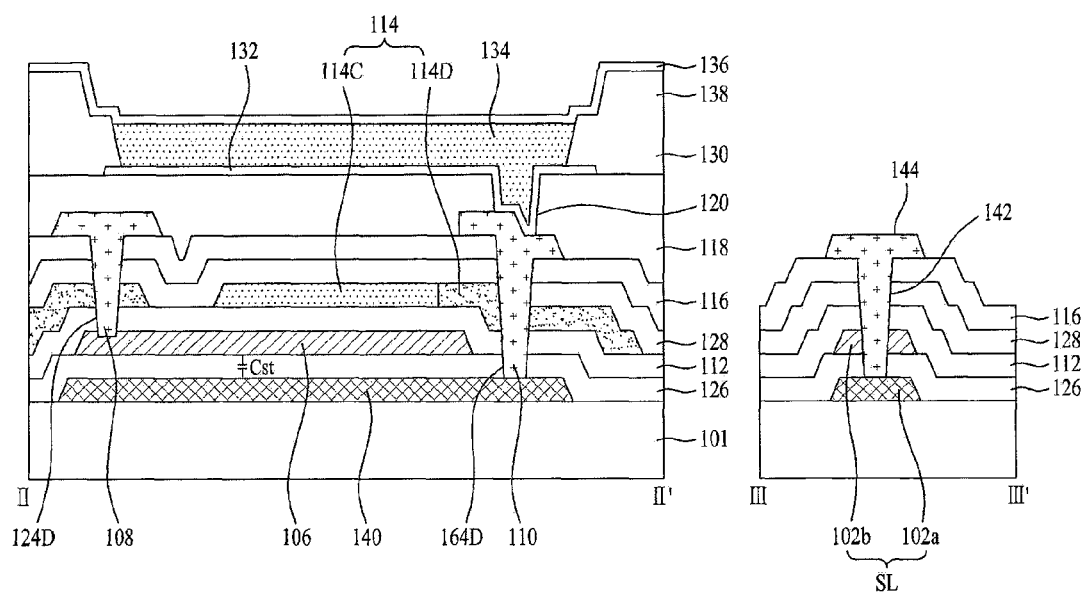
FIG. 16 is a cross-sectional view illustrating the organic light emitting display taken along line II-IP of FIG. 15.

FIG. 15 is a plan view illustrating an organic light emitting display in accordance with another embodiment of the present invention and FIG. 16 is a cross-sectional view illustrating the organic light emitting display taken along line II-II' of FIG. 15.

The organic light emitting display shown in FIGS. 15 and 16 includes the same elements as the organic light emitting display in accordance with the former embodiment of the present invention except that scan lines are formed in a dual structure. Therefore, a detailed description of these elements will be omitted.

A scan line SL includes a first line part 102a and a second line part 102b formed along the first line part 102a.

The first line part 102a is formed of the same material as a storage electrode 140 on a substrate 101 simultaneously with the storage electrode 140.

The second line part 102b is formed of the same material as first to third gate electrodes 156, 106 and 172 on a storage insulating film 126 simultaneously with the first to third gate electrodes 156, 106 and 172, and is electrically connected to the first line part 102a through connection electrodes 144.

The connection electrodes 144 are formed of the same material as data lines DL on a second interlayer insulating film 116 simultaneously with the data lines DL. Such connection electrodes 144 are connected to the upper surface of the first line part 102a and the side surface of the second line part 102b, which are exposed through scan contact holes 142, and thus electrically connects the first and second line parts 102a and 102b to each other. Here, the scan contact holes 142 pass through the storage insulating film 126, the second line part 102b, the gate insulating film 112 and first and second interlayer insulating films 128 and 116 and exposes the upper surface of the first line part 102a and the side surface of the second line part 102b. Such a scan contact hole 142 is formed simultaneously with a second drain contact hole 164D through the same process.

In an embodiment of the present invention, the scan line SL has a dual structure including the first and second line parts 102a and 102b connected to each other through the connection electrodes 144 and thus, the overall resistance value of the scan line SL may be reduced. Particularly, during a crystallization process of active layers 154, 114 and 176 through heat treatment, heat is emitted toward the substrate 101 by high thermal conductivity of the gate electrodes 156, 106 and 172 located below the active layers 154, 114 and 176 and crystallinity of the active layers 154, 114 and 176 is lowered. If, in order to prevent such a drawback, the thickness of the gate electrodes 156, 106 and 172 is reduced, the thickness of the second line part 102b of the scan line SL formed simultaneously with the gate electrodes 156, 106 and 172 is also reduced and signal delay of the scan line SL may be generated. In this instance, the overall resistance value of the scan line SL may be reduced by the first line part 102a connected to the second line part 102b through the connection electrodes 144 and thus, signal change of the scan line SL may be prevented.

The connection electrodes 144 and the scan contact holes 142 are located at both sides of an non-active area located outside an active area AA in which respective subpixels are located, as exemplarily shown in FIG. 15.

Figure 17A:
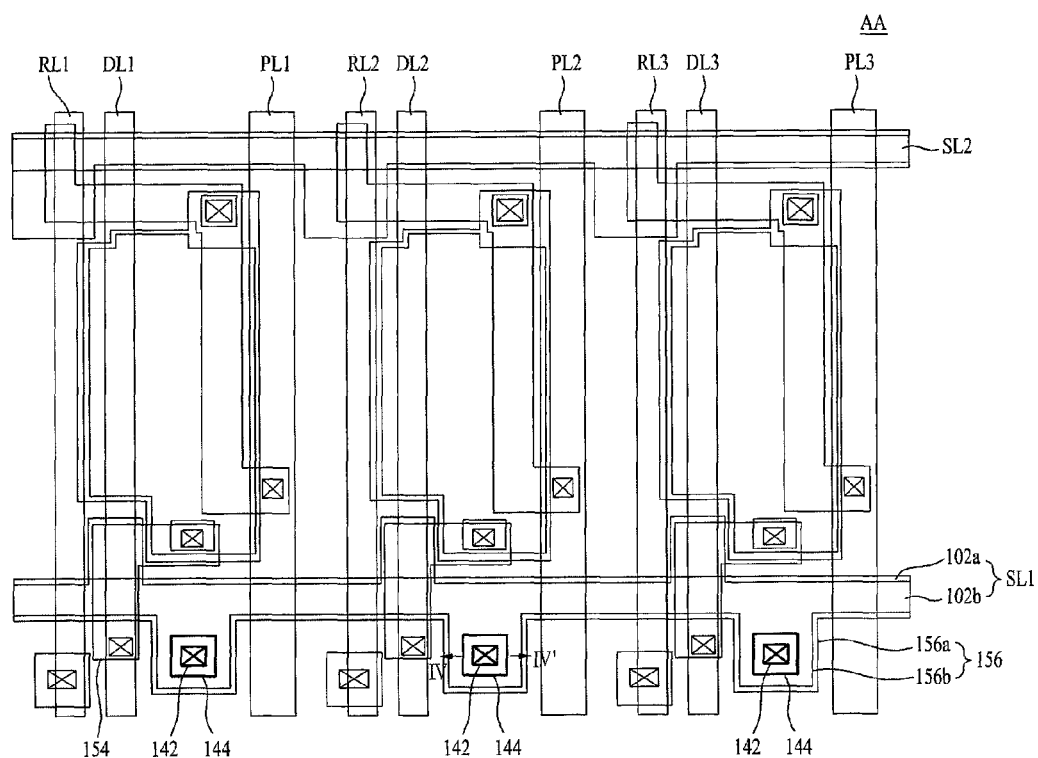
FIGS. 17A to 17C are plan and cross-sectional views illustrating other types of connection electrodes and scan contact holes shown in FIGS. 15 and 16.
Figure 17B:
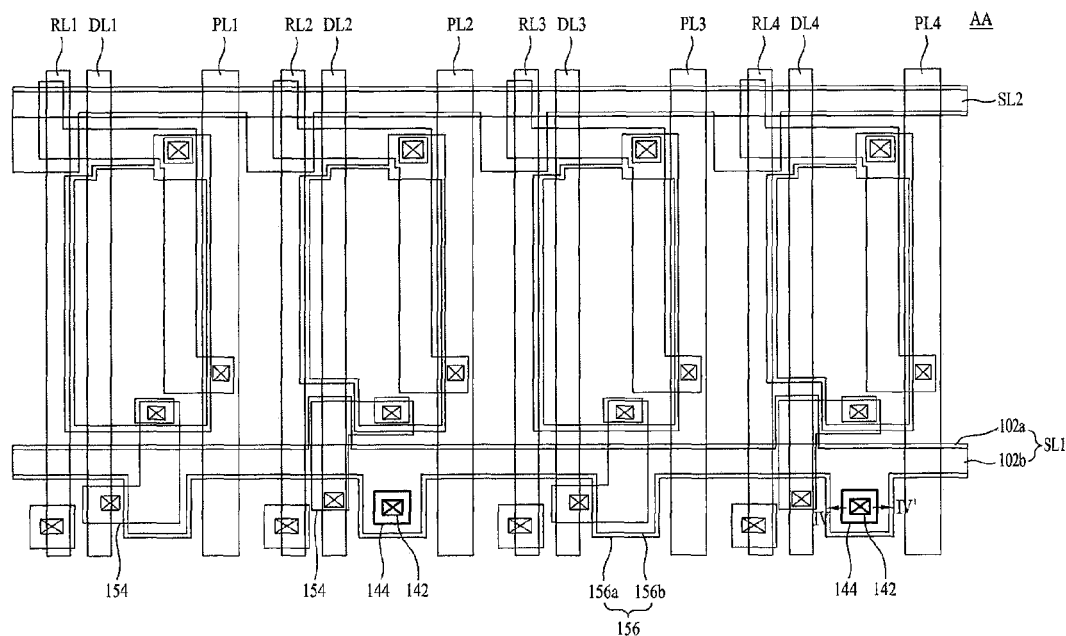

In addition, connection electrodes 144 and scan contact holes 142 may be located inside the active area AA in which respective subpixels are located, or be formed in both the active area AA and the non-active area, as exemplarily shown in FIGS. 17A and 17B.

Figure 17C:
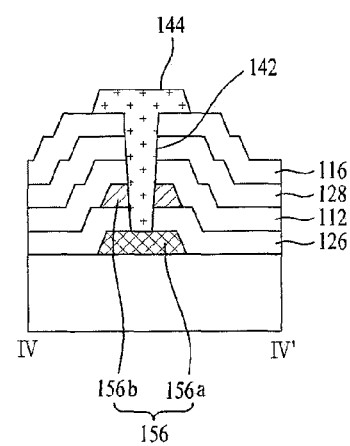

As exemplarily shown in FIG. 17A, the connection electrode 144 and the scan contact hole 142 are formed in each subpixel area and thus, contact characteristics are improved. The connection electrode 144 is electrically connected to a first gate electrode 156 including first and second gate parts 156a and 156b respectively extending from the first and second line parts 102a and 102b through the scan contact hole 142, as exemplarily shown in FIG. 17C. The scan contact hole 142 passes through the storage insulating film 126, the second gate part 156b, the gate insulating film 112 and the first and second interlayer insulating films 128 and 116 and exposes the upper surface of the first gate part 156a and the side surface of the second gate part 156b.

Here, a channel area of the first active layer 154 is formed so as to overlap the data line DL and prevents the connection electrode 144 and the first active layer 154 from being electrically connected to each other through the scan contact hole 142.

As exemplarily shown in FIG. 17B, the connection electrode 144 and the scan contact hole 142 are formed in each i$^{th}$ (herein, i being a natural number) subpixel. The connection electrode 144 is electrically connected to a first gate electrode 156 including first and second gate parts 156a and 156b respectively protruding from the first and second line parts 102a and 102b, as exemplarily shown in FIG. 17C. Here, a channel area of the first active layer 154 of a subpixel provided with the connection electrode 144 and the scan contact hole 142 is formed so as to overlap the data line DL and prevents the connection electrode 144 and the first active layer 154 from being electrically connected to each other through the scan contact hole 142. Further, a channel area of the first active layer 154 of a subpixel provided with no connection electrode 144 and no scan contact hole 142 is formed so as to overlap the first gate electrode 156 and minimizes reduction of the area of the storage electrode 140 and the anode electrode 132.

Although embodiments of the present invention exemplarily describe the organic light emitting display in which each subpixel has a structure including three transistors ST1, ST2, ST3 and one storage capacitor Cst, the present invention is not limited thereto and may be applied to various other structures.

Further, the storage capacitor of embodiments of the present invention may be applied to all flat display panels having thin film transistors in addition to an organic light emitting display.

As apparent from the above description, in an organic light emitting display in accordance with embodiments of the present invention, a storage electrode formed of a low resistance metal without any additional doping process and a gate electrode are disposed below an active layer so as to overlap the active layer. Therefore, the organic light emitting display in accordance with embodiments of the present invention may maximize the area of a storage capacitor and implement high resolution with a single gate structure. Further, in the organic light emitting display in accordance with embodiments of the present invention, since the gate electrode is located below the active layer, short between protrusions of the active layer generated during crystallization of the active layer and the gate electrode may be prevented and thus, reliability may be improved. Further, in the organic light emitting display in accordance with embodiments of the present invention, since impurities, such as mobile charges introduced from a substrate 101 formed of a flexible material, such as polyimide, are blocked by the storage electrode, degradation of current of a driving transistor may be prevented and thus, reliability may be improved. Further, in the organic light emitting display in accordance with embodiments of the present invention, switching transistors, the driving transistor and the storage capacitor may be formed using 6 photo masks without an expensive half tone mask and thus, costs may be reduced and process reliability may be improved. Moreover, in the organic light emitting display in accordance with embodiments of the present invention, since a scan line connected to the gate electrode is formed in a dual structure, the active layer located above the gate electrode may be crystallized without increase in the thickness of the gate electrode and lowering of crystallinity of the active layer may be prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A subpixel structure for a display device, the subpixel structure comprising:
    a light emitting diode formed on a substrate;
    a first switching transistor including a first gate electrode connected to a first scan line, a first source electrode connected to a data line, a first drain electrode, and a first active layer forming a first channel part between the first source electrode and the first drain electrode;
    a driving transistor including a second gate electrode, a second source electrode, a second drain electrode, and a second active layer forming a second channel part between the second source electrode and the second drain electrode, wherein the driving transistor is connected to the first switching transistor and the light emitting diode;
    a second switching transistor including a third gate electrode connected to a second scan line, a third source electrode, the second a third drain electrode, and a third active layer forming a third channel part between the third source electrode and the second drain electrode; and
    a storage capacitor connected to the first switching transistor and the driving transistor,
    wherein at least one of the first, second and third gate electrodes is disposed between the corresponding first, second and third active layers and the substrate,
    wherein the second gate electrode forms at least a portion of a top electrode of the storage capacitor, and
    wherein the second gate electrode is disposed between the second active layer and the substrate.

2. The subpixel structure according to claim 1, wherein the storage capacitor includes a storage electrode in contact with the substrate and disposed under the light emitting diode and overlapping the second gate electrode.

3. The subpixel structure according to claim 2, wherein the substrate is a flexible substrate formed of a flexible material.

4. The subpixel structure according to claim 2, wherein the storage electrode overlapping the second gate electrode of the driving transistor includes an insulating film disposed between the storage electrode and the second gate electrode to form the storage capacitor.

5. The subpixel structure according to claim 1, wherein each of the first and second scan lines comprises a dual layer structure including first and second line parts connected to each other and an insulating film disposed therebetween.

6. The subpixel structure according to claim 1, wherein the first, second and third active layers are formed on a gate insulating film and the gate insulating film is formed on the first, second and third gate electrodes.

7. The subpixel structure according to claim 1,
    wherein a storage electrode is disposed under the light emitting diode and overlaps with the second gate electrode of the driving transistor with a storage insulating film disposed therebetween to form the storage capacitor, and
    wherein each of the first and second scan lines comprises a dual layer structure including first and second line parts connected to each other and the storage insulating film disposed therebetween.

8. The subpixel structure according to claim 1, wherein at least one of the first, second and third active layers is made of polycrystalline silicon.

9. The subpixel structure according to claim 1, further comprising an anode electrode connected to a storage electrode through a drain contact hole.

10. A display device comprising:
    a display panel including a plurality of pixels, at least one pixel of the plurality of pixels including the subpixel structure according to claim 1.

11. The display device according to claim 10, wherein the storage capacitor includes a storage electrode in contact with the substrate and disposed under the light emitting diode and overlapping the second gate electrode.

12. The display device according to claim 11, wherein the storage electrode overlapping the second gate electrode of the driving transistor includes an insulating film disposed between the storage electrode and the second gate electrode to form the storage capacitor.

13. The display device according to claim 10, wherein each of the first and second scan lines comprises a dual layer structure including first and second line parts connected to each other and an insulating film disposed therebetween.

14. The display device according to claim 10, wherein the substrate is a flexible substrate formed of a flexible material, and wherein the first, second and third active layers are formed on a gate insulating film and the gate insulating film is formed on the first, second and third gate electrodes.

15. The display device according to claim 10, wherein a storage electrode overlaps with the second gate electrode of the driving transistor with a storage insulating film disposed therebetween to form the storage capacitor, and wherein each of the first and second scan lines comprises a dual layer structure including first and second line parts connected to each other and the storage insulating film disposed therebetween.

16. A display panel comprising a plurality of pixels, at least one pixel of the plurality of pixels including the subpixel structure according to claim 1, wherein the at least one pixel of the plurality of pixels includes a plurality of subpixels, each subpixel having a scan contact hole formed in a corresponding subpixel area comprising a connection electrode connected to the first scan line.

17. A display panel comprising a plurality of pixels, at least one pixel of the plurality of pixels including the subpixel structure according to claim 1, wherein the at least one pixel of the plurality of pixels includes a plurality of adjacent subpixels, and every other adjacent subpixel includes a scan contact hole formed in a corresponding subpixel area comprising a connection electrode connected to the first scan line.

* * * * *